(12) United States Patent
Hsu et al.

(10) Patent No.: US 11,152,316 B2
(45) Date of Patent: Oct. 19, 2021

(54) METHOD OF FORMING CONTACT HOLES IN A FAN OUT PACKAGE

(71) Applicant: Taiwan Semiconductor Manufacturing Company, Ltd., Hsinchu (TW)

(72) Inventors: Feng-Cheng Hsu, New Taipei (TW); Szu-Wei Lu, Hsinchu (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/954,244

(22) Filed: Apr. 16, 2018

(65) Prior Publication Data

US 2018/0240764 A1    Aug. 23, 2018

Related U.S. Application Data

(62) Division of application No. 15/175,879, filed on Jun. 7, 2016, now Pat. No. 9,947,629, which is a division
(Continued)

(51) Int. Cl.
*H01L 23/00* (2006.01)
*H01L 23/48* (2006.01)
(Continued)

(52) U.S. Cl.
CPC ............ *H01L 24/02* (2013.01); *H01L 21/563* (2013.01); *H01L 23/481* (2013.01); *H01L 24/05* (2013.01);
(Continued)

(58) Field of Classification Search
CPC ......... H01L 24/02; H01L 24/05; H01L 24/13; H01L 21/563; H01L 24/19; H01L 23/481;
(Continued)

(56) References Cited

U.S. PATENT DOCUMENTS 5,830,804 A    11/1998  Cleeves et al.
9,947,629 B2 *  4/2018  Hsu .................. H01L 23/481
(Continued)

FOREIGN PATENT DOCUMENTS

JP    2001255556 A    9/2001
JP    2007305960 A    11/2007

*Primary Examiner* — Bitew A Dinke
(74) *Attorney, Agent, or Firm* — Slater Matsil, LLP

(57) ABSTRACT

Methods of forming packages include forming an encapsulant laterally encapsulating a die over an active surface of the die. The active surface has an electrical pad. A first opening is formed through the encapsulant to the electrical pad. In some embodiments the first opening is formed using a photolithographic technique. In some embodiments the first opening is formed using a temporary pillar by forming the temporary pillar over the electrical pad, forming the encapsulant, and then exposing and removing the temporary pillar. A conductive pattern is formed over the encapsulant including a via formed in the first opening to the electrical pad of the die's active surface. In some embodiments, a dielectric layer is formed over the encapsulant, and the conductive pattern is over the dielectric layer. Embodiments may include forming additional dielectric layers and conductive patterns.

20 Claims, 8 Drawing Sheets

Related U.S. Application Data of application No. 14/103,253, filed on Dec. 11, 2013, now Pat. No. 9,379,041.

(51) Int. Cl.
  H01L 21/56 (2006.01)
  H01L 23/31 (2006.01)

(52) U.S. Cl.
  CPC .............. *H01L 24/13* (2013.01); *H01L 24/19* (2013.01); *H01L 23/3128* (2013.01); *H01L 2224/02315* (2013.01); *H01L 2224/02331* (2013.01); *H01L 2224/02379* (2013.01); *H01L 2224/0401* (2013.01); *H01L 2224/04105* (2013.01); *H01L 2224/05024* (2013.01); *H01L 2224/12105* (2013.01); *H01L 2224/13026* (2013.01); *H01L 2224/32225* (2013.01); *H01L 2224/73267* (2013.01); *H01L 2224/92244* (2013.01); *H01L 2924/181* (2013.01)

(58) Field of Classification Search
  CPC . H01L 2224/02315; H01L 2224/13026; H01L 2224/02379; H01L 2224/0401
  See application file for complete search history.

(56) References Cited

U.S. PATENT DOCUMENTS

| Patent/Pub No. | Date | Inventor | Classification |
|---|---|---|---|
| 10,177,078 B2* | 1/2019 | Yu | H01L 25/0657 |
| 10,276,541 B2* | 4/2019 | Chen | H01L 21/76804 |
| 10,297,544 B2* | 5/2019 | Wu | H01L 21/76802 |
| 2004/0049912 A1* | 3/2004 | Akagawa | H01L 23/5389 29/846 |
| 2005/0122698 A1* | 6/2005 | Ho | H01L 23/5389 361/761 |
| 2006/0145328 A1* | 7/2006 | Hsu | H01L 23/5389 257/690 |
| 2007/0241457 A1 | 10/2007 | Ida | |
| 2008/0029895 A1* | 2/2008 | Hu | H01L 23/5389 257/762 |
| 2008/0224249 A1 | 9/2008 | Nabe et al. | |
| 2008/0237836 A1* | 10/2008 | Chia | H01L 21/568 257/698 |
| 2008/0296273 A1 | 12/2008 | Lei et al. | |
| 2009/0039491 A1 | 2/2009 | Kim et al. | |
| 2010/0013087 A1* | 1/2010 | England | H01L 23/5389 257/700 |
| 2011/0042796 A1* | 2/2011 | Chang | H01L 23/16 257/690 |
| 2011/0121445 A1* | 5/2011 | Mori | H01L 24/19 257/693 |
| 2011/0215450 A1* | 9/2011 | Chi | H01L 24/19 257/660 |
| 2011/0215464 A1* | 9/2011 | Guzek | H01L 21/56 257/737 |
| 2011/0215478 A1 | 9/2011 | Yamamichi et al. | |
| 2011/0221069 A1* | 9/2011 | Kunimoto | H01L 23/5389 257/774 |
| 2011/0241215 A1* | 10/2011 | Sankman | H01L 24/19 257/773 |
| 2011/0291249 A1* | 12/2011 | Chi | H01L 21/4832 257/675 |
| 2012/0119379 A1* | 5/2012 | Koizumi | H01L 24/20 257/774 |
| 2012/0161279 A1 | 6/2012 | Lin et al. | |
| 2012/0161331 A1 | 6/2012 | Gonzalez et al. | |
| 2013/0001762 A1* | 1/2013 | Chi | H01L 21/4832 257/676 |
| 2013/0001776 A1* | 1/2013 | Yu | H01L 21/561 257/738 |
| 2013/0049195 A1 | 2/2013 | Wu et al. | |
| 2013/0093078 A1* | 4/2013 | Lin | H01L 25/0657 257/737 |
| 2013/0105982 A1 | 5/2013 | Jin et al. | |
| 2013/0134559 A1 | 5/2013 | Lin et al. | |
| 2013/0168849 A1* | 7/2013 | Scanlan | H01L 21/78 257/737 |
| 2013/0168874 A1 | 7/2013 | Scanlan | |
| 2013/0187270 A1 | 7/2013 | Yu et al. | |
| 2013/0210198 A1 | 8/2013 | Lin | |
| 2013/0241077 A1 | 9/2013 | Fuergut et al. | |
| 2013/0249104 A1* | 9/2013 | Chi | H01L 23/49822 257/774 |
| 2013/0264684 A1* | 10/2013 | Yu | H01L 21/561 257/616 |
| 2013/0307143 A1 | 11/2013 | Lin et al. | |
| 2013/0320553 A1* | 12/2013 | Kuo | H01L 23/528 257/774 |
| 2013/0341800 A1* | 12/2013 | Tu | H01L 23/585 257/774 |
| 2014/0008809 A1* | 1/2014 | Scanlan | H01L 21/561 257/773 |
| 2014/0070396 A1* | 3/2014 | Kyozuka | H01L 24/24 257/698 |
| 2014/0091482 A1* | 4/2014 | Lin | H01L 21/565 257/782 |
| 2014/0093999 A1 | 4/2014 | Teh et al. | |
| 2014/0110856 A1* | 4/2014 | Lin | H01L 23/49827 257/774 |
| 2014/0252579 A1 | 9/2014 | Chang et al. | |
| 2014/0332975 A1 | 11/2014 | Raorane et al. | |
| 2014/0353838 A1 | 12/2014 | Lin et al. | |
| 2014/0363929 A1* | 12/2014 | Malatkar | H01L 25/16 438/127 |
| 2014/0367160 A1 | 12/2014 | Yu et al. | |
| 2014/0367848 A1* | 12/2014 | Chi | H01L 24/24 257/737 |
| 2015/0008587 A1 | 1/2015 | Lin et al. | |
| 2015/0123300 A1 | 5/2015 | Tanabe et al. | |
| 2016/0064329 A1* | 3/2016 | Lee | H01L 23/36 257/659 |
| 2016/0197022 A1* | 7/2016 | Pagaila | H01L 21/561 257/773 |
| 2017/0186703 A1* | 6/2017 | Chiang | H01L 21/568 |
| 2018/0158746 A1* | 6/2018 | Lin | H01L 24/19 |

\* cited by examiner ns and characters in the figures below

METHOD OF FORMING CONTACT HOLES IN A FAN OUT PACKAGE

PRIORITY CLAIM AND CROSS-REFERENCE

This application is a divisional of U.S. application Ser. No. 15/175,879 filed on Jun. 7, 2016, issued as U.S. Pat. No. 9,947,629 on Apr. 17, 2018, which is a divisional of U.S. application Ser. No. 14/103,253, filed on Dec. 11, 2013, issued as U.S. Pat. No. 9,379,041 on Jun. 28, 2016, which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely fan-out package structures and methods of forming such structures. Embodiments may also be applied, however, to other package structures. Embodiments discussed herein are to provide examples to enable making or using the subject matter of this disclosure, and a person having ordinary skill in the art will readily understand modifications that can be made while remaining within contemplated scopes of different embodiments. Figures and discussion below illustrate simplified structures so as to not obscure various features and to omit redundant features that would be apparent to a person of ordinary skill in the art. Like reference numbers and characters in the figures below refer to like components. Although method embodiments may be discussed as being performed in a particular order, other method embodiments may be performed in any logical order.

Figure 1:
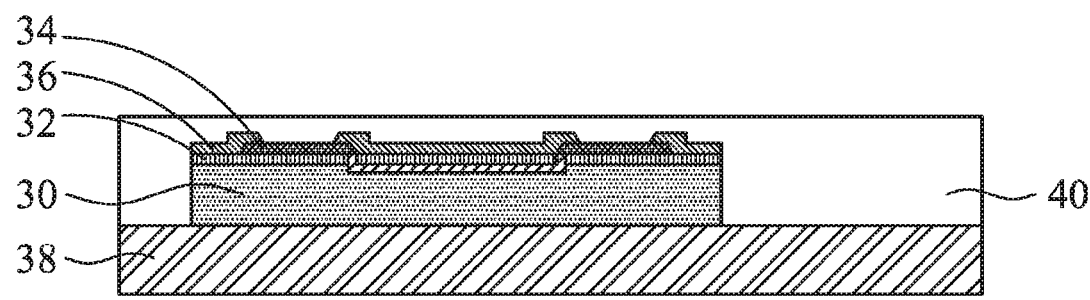
FIGS. 1 through 7 are various intermediate structures in a process according to an embodiment.

FIGS. 1 through 7 illustrate various intermediate structures in a process according to an embodiment. FIG. 1 illustrates a die 30 encapsulated by a dielectric-encapsulant 40. The die 30 includes a top metallization layer 32, a pad 34 (such as an electrical connector pad), and a passivation layer 36 on an active side of the die 30. The die 30 may be, for example, a logic integrated circuit, a memory die, an analog die, or any other die. The die 30 may comprise a semiconductor substrate, such as a bulk semiconductor substrate, semiconductor-on-insulator substrate, or the like, on which active devices, such as transistors, and/or passive devices, such as capacitors, inductors, or the like, are formed according to semiconductor processes. Metallization layers, including top metallization layer 32, may be on the semiconductor substrate and may comprise interconnect structures to electrically couple devices together and/or to a pad 34. The pads 34 are exposed through respective openings in the passivation layer 36.

In an example, the die 30 may be formed as part of a wafer. The wafer is singulated, such as by dicing or sawing, to form individual dies 30. The die 30 is placed on a carrier substrate 38, which may be a glass substrate, silicon substrate, aluminum oxide substrate, or the like, using, for example, a pick-and-place tool, and the die 30 is adhered to the carrier substrate 38 by a die attach film, such as any suitable adhesive, epoxy, ultraviolet (UV) glue (which loses its adhesive property when exposed to UV lights), or the like. The pads 34 and passivation layer 36 are placed opposite from the carrier substrate 38.

In FIG. 1, the dielectric-encapsulant 40 is formed laterally encapsulating the die 30 and over the passivation layer 36 and pads 34. As shown, the dielectric-encapsulant 40 continuously extends from a region disposed laterally from the die 30 to a region disposed directly above the die 30. For example, there is no vertical interface (where vertical, as shown, is in a direction perpendicular to a top surface of the die 30) with a different dielectric material near a lateral edge of the die 30, e.g., not directly over pad 34 of the die 30. The dielectric-encapsulant 40 can comprise epoxy molding compound or any other dielectric materials that sustains the die 30 embedded in encapsulant 40 over substrate 38, and may be formed using a compression molding process, a lamination process, or the like. In an embodiment, the dielectric-encapsulant 40 is photo-patternable.

Figure 2:
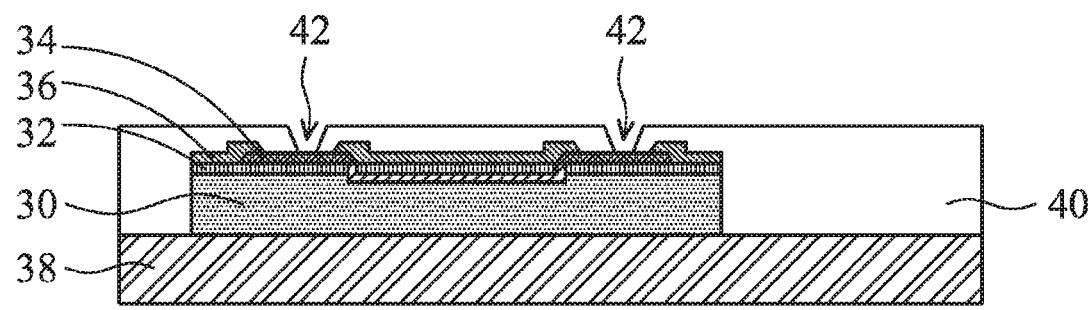

In FIG. 2, openings 42 are formed in the dielectric-encapsulant 40 to expose the pads 34. The openings 42 may be formed using an acceptable photolithography technique to expose the dielectric-encapsulant 40 to light. In such an embodiment, the dielectric-encapsulant 40 is developed and/or cured after the exposure.

Figure 3:
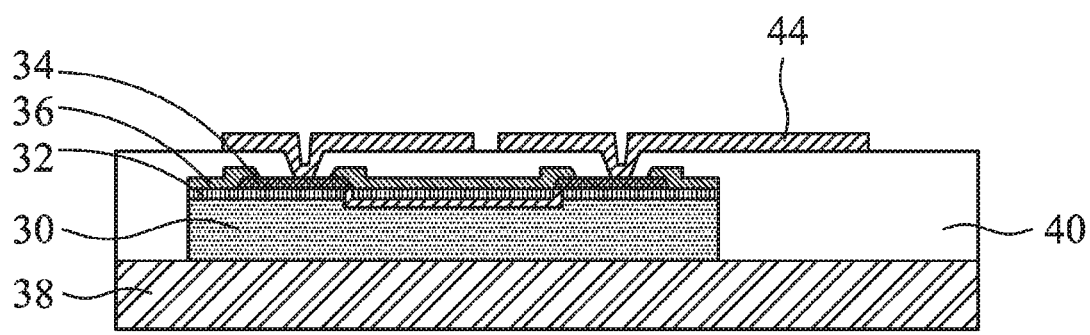
Figure 22:
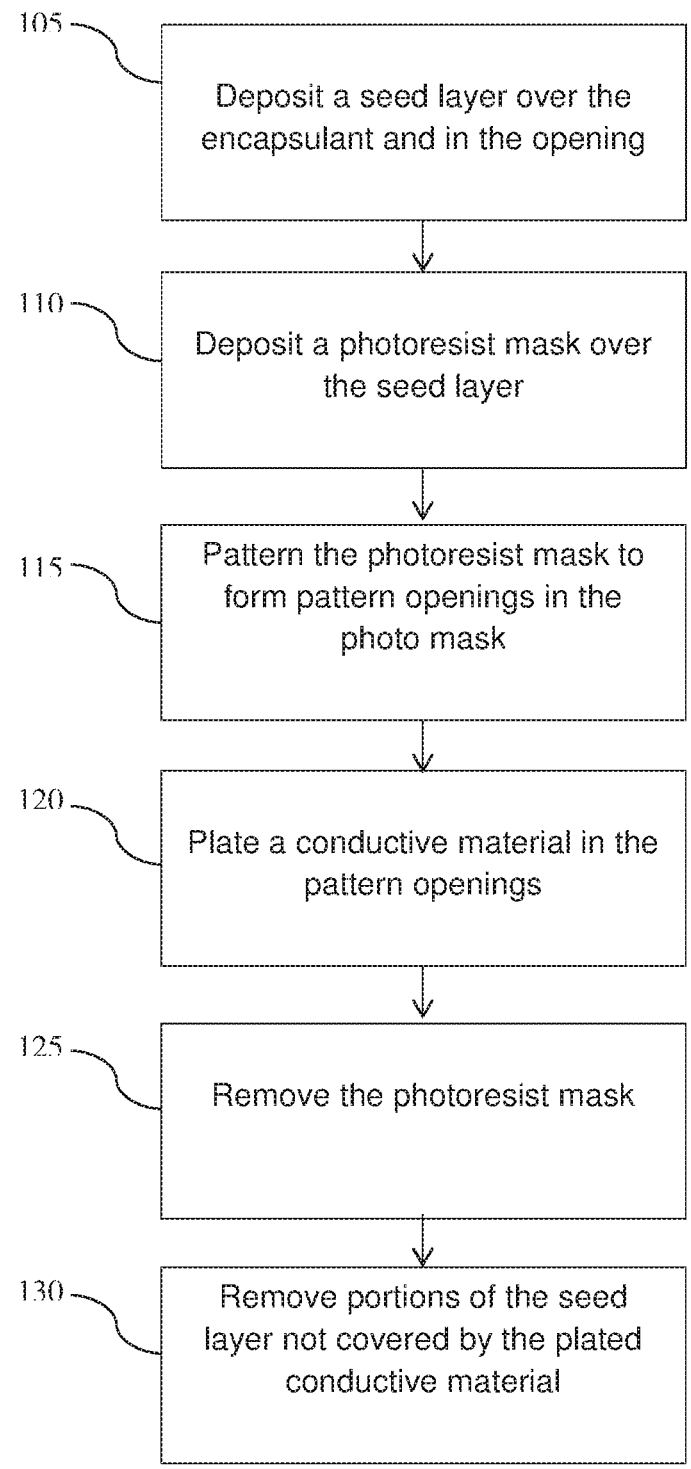
FIG. 22 illustrates a flow diagram of a deposition process for a conductive layer, in accordance with some embodiments.

In FIG. 3, a first conductive pattern 44 is formed over the dielectric-encapsulant 40 and in the openings 42 to the pads 34. The first conductive pattern 44 comprises various traces and/or vias, such as vias in the openings 42. The first conductive pattern 44 in an example comprises a metal such as copper, titanium, the like, or a combination thereof, formed by a plating process, such as electroless plating, electroplating, or the like. For example, as illustrated in FIG. 22, process 105, a seed layer is deposited over the dielectric-encapsulant 40 and in the openings 42. The seed layer can be copper, titanium, the like, or a combination thereof deposited by atomic layer deposition (ALD), sputtering, another physical vapor deposition (PVD) process, or the like. A photoresist is deposited and patterned exposing the pattern for the first conductive pattern 44 that is desired, such as by an acceptable photolithography technique, as illustrated in FIG. 22, processes 110 and 115. A conductive material, such as copper, aluminum, the like, or a combination thereof, is deposited on the seed layer by electroless plating, electroplating, or the like, as illustrated in FIG. 22, process 120. The photoresist is removed, such as an appropriate photoresist stripping process, as illustrated in FIG. 22, process 125. Remaining exposed seed layer portions are removed, such as by a wet or dry etch, as illustrated in FIG. 22, process 130.

Figure 4:
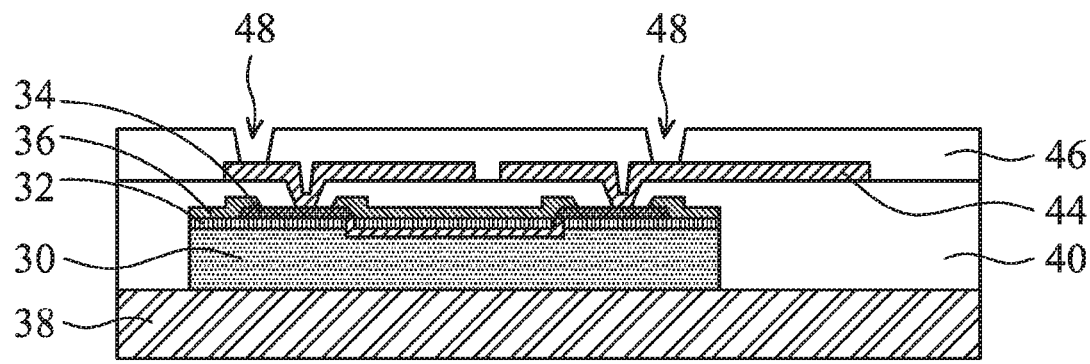

In FIG. 4, a second dielectric layer 46 is formed over the dielectric-encapsulant 40 and the first conductive pattern 44. The second dielectric layer 46 may comprise a polybenzoxazole (PBO), polyimide, benzocyclobutene (BCB), the like, or a combination thereof. The second dielectric layer 46 can be deposited by a spin coating process, laminating process, the like, or a combination thereof. Openings 48 are formed through the second dielectric layer 46 to portions of the first conductive pattern 44 using an acceptable photolithography technique, such as including exposing to light the portions of the second dielectric layer 46 where the openings 48 are to be formed. The second dielectric layer 46 may be developed and/or cured after the exposure.

Figure 5:
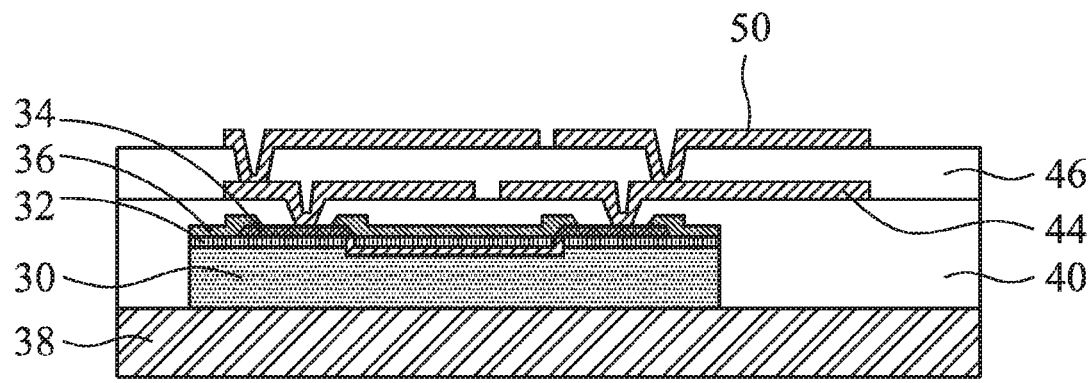

In FIG. 5, a second conductive pattern 50 is formed over the second dielectric layer 46 and in the openings 48 to the portions of the first conductive pattern 44. The second conductive pattern 50 comprises various traces and/or vias. The second conductive pattern 50 in an example comprises a metal such as copper, titanium, the like, or a combination thereof, formed by a plating process, such as electroless plating, electroplating, or the like, such as discussed above with respect to FIG. 3.

Figure 6:
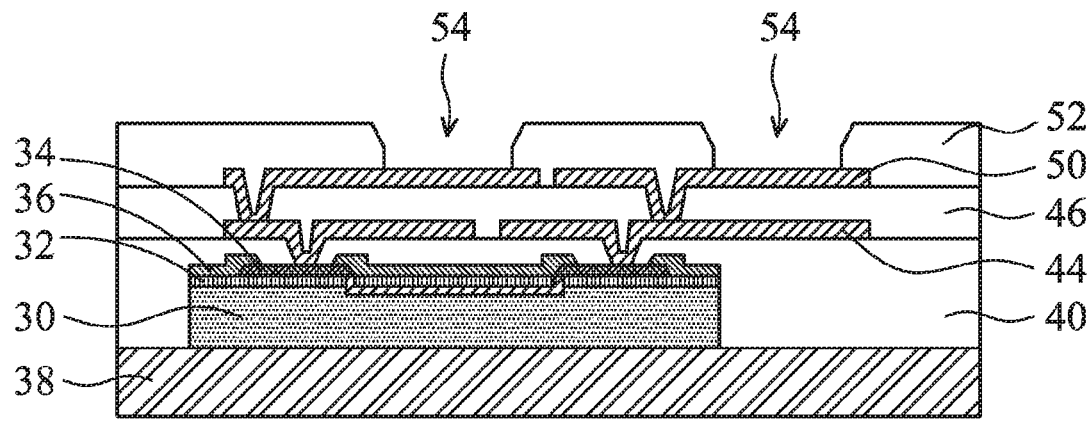

In FIG. 6, a third dielectric layer 52 is formed over the second dielectric layer 46 and the second conductive pattern 50. The third dielectric layer 52 may comprise a PBO, polyimide, BCB, the like, or a combination thereof. The third dielectric layer 52 can be deposited by a spin coating process, laminating process, the like, or a combination thereof. Openings 54 are formed through the third dielectric layer 52 to portions of the second conductive pattern 50 using an acceptable photolithography technique, such as including exposing to light the portions of the third dielectric layer 52 where the openings 54 are to be formed. The third dielectric layer 52 may be developed and/or cured after the exposure.

Figure 7:
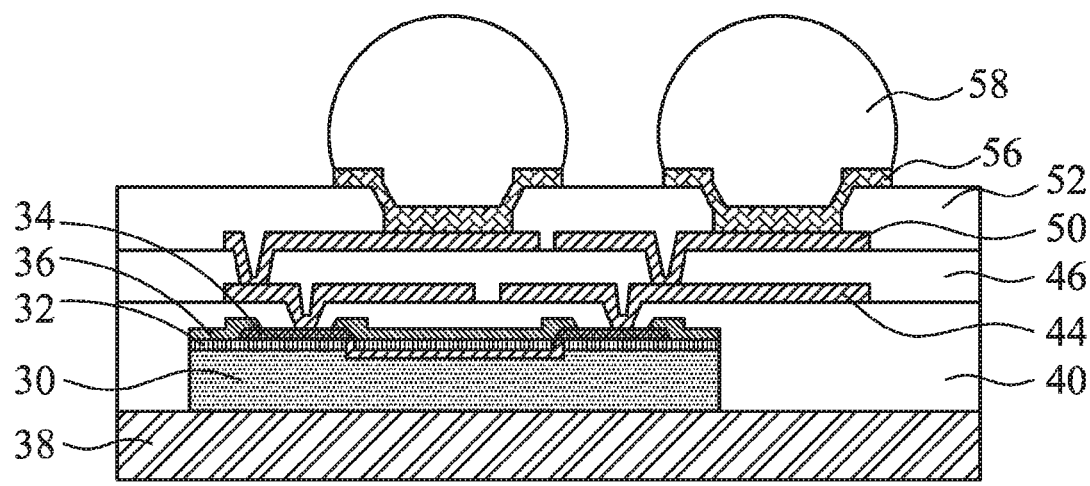

In FIG. 7, bond pads 56 and external electrical connectors 58 are formed. The bond pads 56 are formed directly coupled to the portions of the second conductive pattern 50, in the openings 54, and over a portion of a top surface of the third dielectric layer 52. The bond pads 56 in an example may each be an under bump metal (UBM) and may each comprise a metal such as copper, titanium, the like, or a combination thereof, formed by a plating process, such as electroless plating, electroplating, or the like, such as discussed above with respect to FIG. 3. The external electrical connectors 58, such as balls or bumps, are formed on respective bond pads 56. The external electrical connectors 58 may comprise solder, such as lead-free solder, and may be formed using an acceptable ball drop process. The formed package structure may then be removed from the carrier substrate 38, such as by exposing the die attach film to a solvent or UV light (when the die attach film is UV glue, for example).

Figure 8:
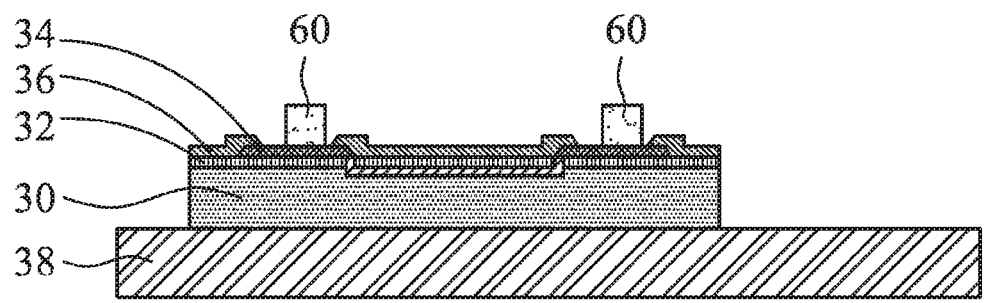
FIGS. 8 through 15 are various intermediate structures in various processes according to other embodiments.

FIGS. 8 through 15 illustrate various intermediate structures in various processes according to embodiments. For example, steps discussed with respect to FIG. 11 may replace steps in FIGS. 9 and 10. In FIG. 8, temporary pillars 60 are formed on pads 34 of the die 30. In an embodiment, the temporary pillars 60 are photoresist pillars. As discussed with respect to the example in FIG. 1, the die 30 may be formed as part of a wafer. Before singulation, a photoresist material may be formed over the wafer and patterned into the photoresist pillars. The wafer is then singulated to form individual dies 30, and the die 30 is attached to the carrier substrate 38 using a die attach film. In other embodiments, the temporary pillars 60 may be any material deposited and patterned, such as by using photolithography and etching techniques, on the pads 34, such as before or after singulation of the die 30.

Figure 9:
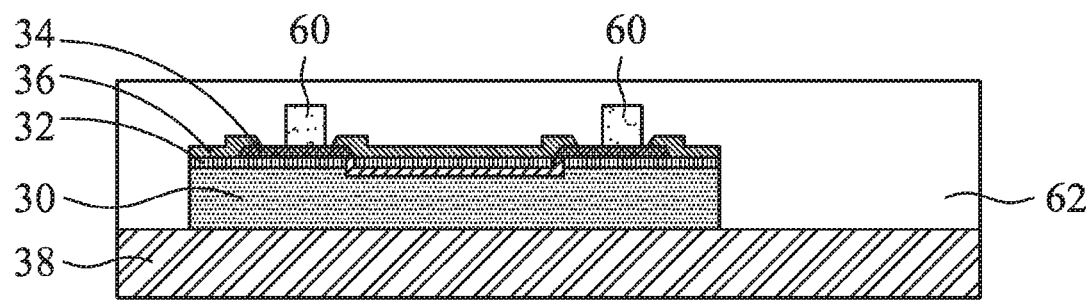
Figure 10:
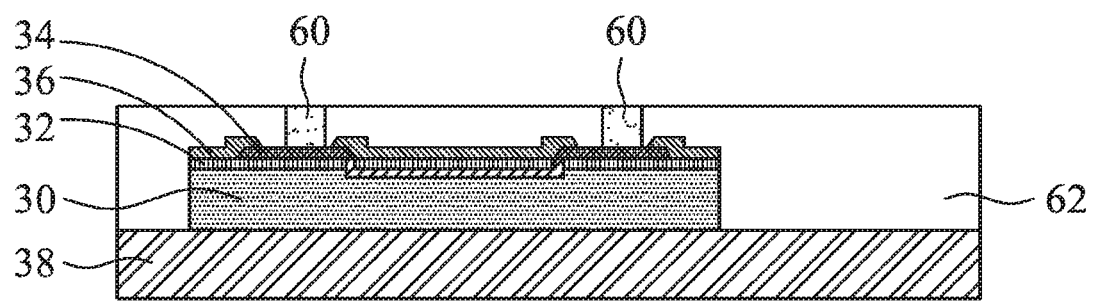

In FIG. 9, an encapsulant 62 is formed encapsulating the die 30 to a height greater than the height of the temporary pillars 60, and in FIG. 10, the encapsulant 62 is then ground back to expose the temporary pillars 60. The encapsulant 62 may be a molding compound, or the like, and may also have dielectric properties. The encapsulant 62 may be formed using a compression molding process, a lamination process, or the like, and then, may be cured. In FIG. 10, the encapsulant 62 is ground, such as by using a grinding wheel and/or chemical mechanical polish (CMP), to expose the temporary pillars 60.

Figure 11:
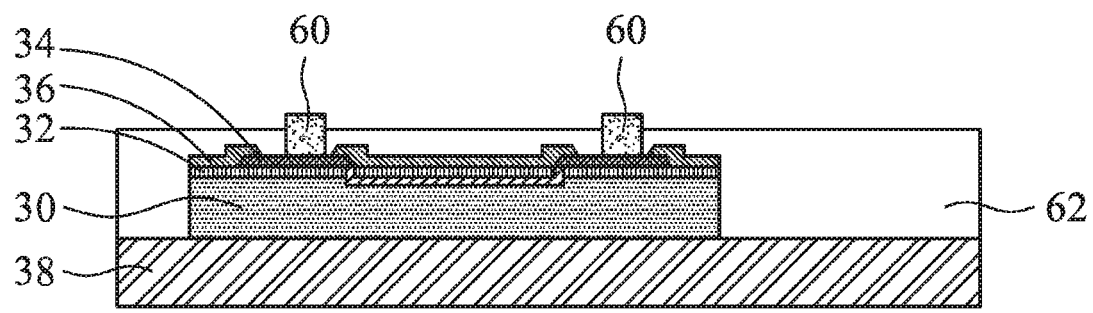

In FIG. 11, the encapsulant 62 is formed with the temporary pillars 60 being exposed through the encapsulant 62. The temporary pillars 60 may be exposed through the encapsulant 62, for example, by using a compression molding process with a compressible and releasable film on a mold plate. When the compression plate with the compressible film contacts the encapsulant 62, the temporary pillars 60 may be pressed into the compressible film, and the compressive force may cause the encapsulant to recede to a level below top portions of the temporary pillars 60. Example materials for a compressible film on the mold plate include silicone or the like. A compressible film may be, for example, 200 μm thick.

Figure 12:
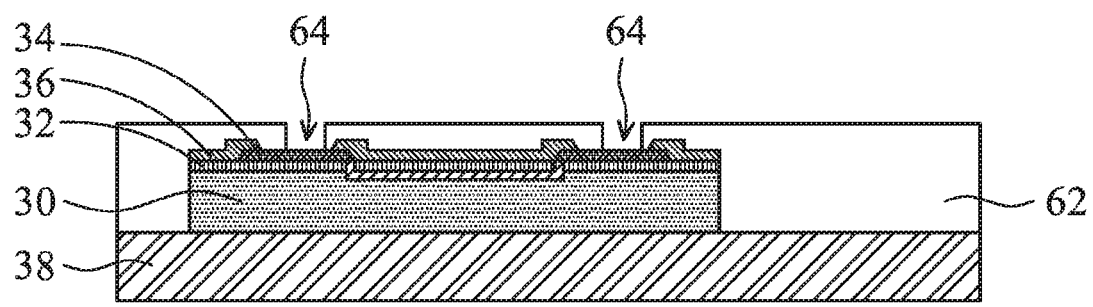

In FIGS. 10 and 11, the encapsulant 62 is formed laterally encapsulating the die 30 and over the passivation layer 36 and pads 34. As shown, the encapsulant 62 continuously extends from a region disposed laterally from the die 30 to a region disposed directly above the die 30. For example, there is no vertical interface (where vertical, as shown, is in a direction perpendicular to a top surface of the die 30) with a different dielectric material near a lateral edge of the die 30, e.g., not directly over pad 34 of the die 30. After FIG. 10 or FIG. 11, the temporary pillars 60 are removed to create openings 64 to the pads 34, as shown in FIG. 12. In embodiments where the temporary pillars 60 are a photoresist, the temporary pillars 60 may be removed using an appropriate stripping process. In other embodiments, the temporary pillars 60 may be removed by etching.

Figure 13:
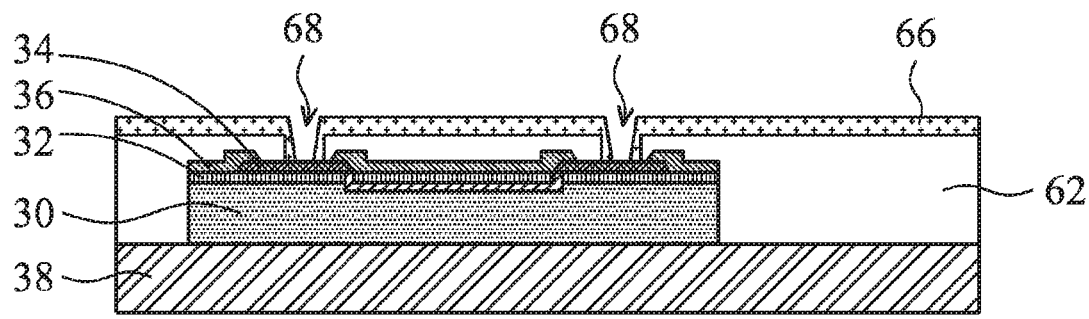

In FIG. 13, a first dielectric layer 66 is formed over the encapsulant 62 and is patterned to create openings 68 through openings 64 to expose the pads 34. The first dielectric layer 66 may comprise a PBO, polyimide, BCB, the like, or a combination thereof. The first dielectric layer 66 can be deposited by a spin coating process, laminating process, the like, or a combination thereof. Openings 68 are formed through the first dielectric layer 66 to the pads 34 using an acceptable photolithography technique, such as including exposing to light the portions of the first dielectric layer 66 where the openings 68 are to be formed. The first dielectric layer 66 may be developed and/or cured after the exposure.

Figure 14:
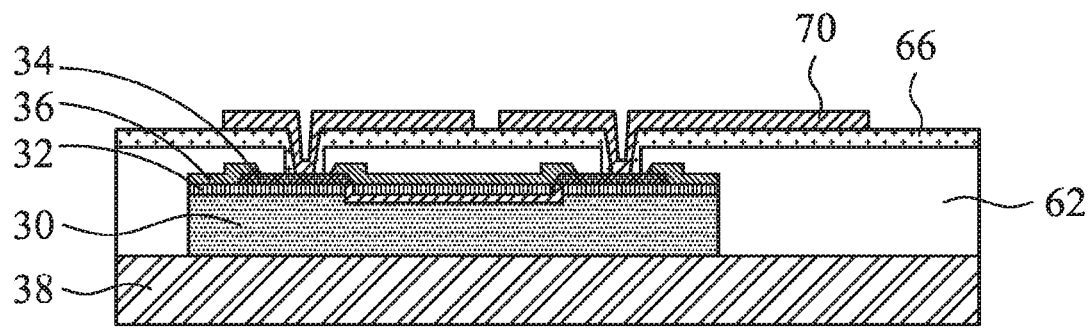

In FIG. 14, a first conductive pattern 70 is formed over the first dielectric layer 66 and in the openings 68 to the pads 34. The first conductive pattern 70 comprises various traces and/or vias. The first conductive pattern 70 in an example comprises a metal such as copper, titanium, the like, or a combination thereof, formed by a plating process, such as electroless plating, electroplating, or the like, such as discussed above with respect to FIG. 3.

Figure 15:
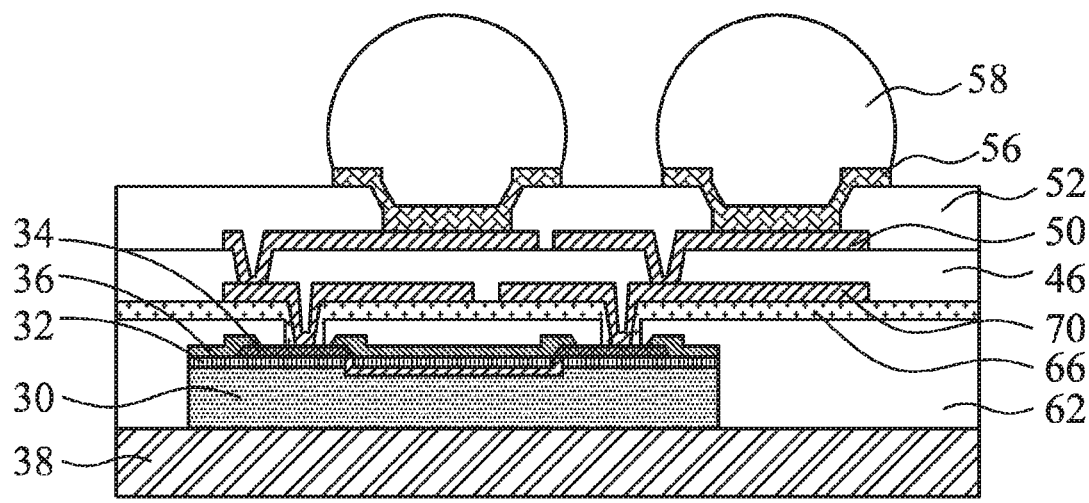

In FIG. 15, the second dielectric layer 46, second conductive pattern 50, third dielectric layer 52, bond pads 56, and external electrical connectors 58 are formed as discussed with respect to FIGS. 4 through 7.

FIGS. 16 through 21 illustrate various intermediate structures in various processes according to embodiments. For example, steps discussed with respect to FIG. 18 may replace steps in FIGS. 16 and 17. As in FIG. 8 above, temporary pillars 60 are formed on pads 34 of the die 30. In an embodiment, the temporary pillars 60 are photoresist pillars. As discussed with respect to the example in FIG. 1, the die 30 may be formed as part of a wafer. Before singulation, a photoresist material may be formed over the wafer and patterned into the photoresist pillars. The wafer is then singulated to form individual dies 30, and the die 30 is attached to the carrier substrate 38 using a die attach film. In other embodiments, the temporary pillars 60 may be any material deposited and patterned, such as by using photolithography and etching techniques, on the pads 34, such as before or after singulation of the die 30.

Figure 16:
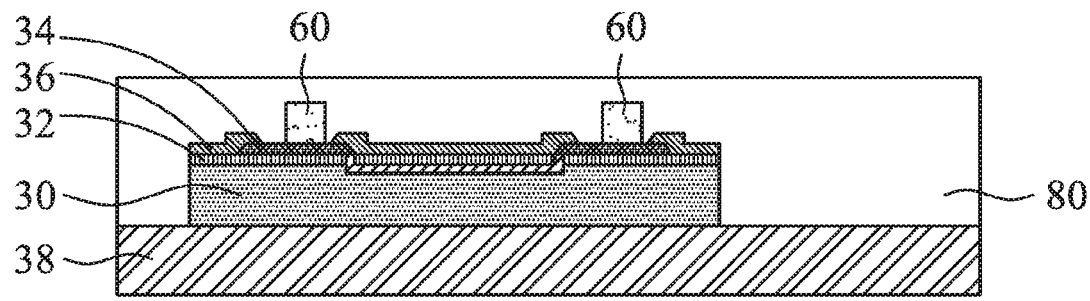
FIGS. 16 through 21 are various intermediate structures in various processes according to further embodiments.
Figure 17:
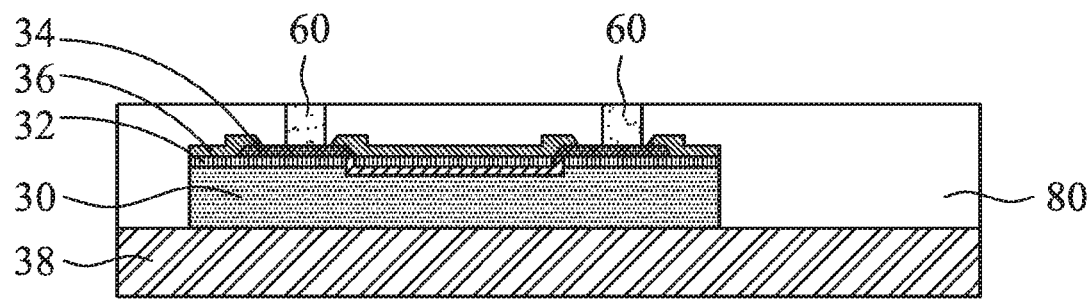

In FIG. 16, a dielectric-encapsulant 80 is formed encapsulating the die 30 to a height greater than the height of the temporary pillars 60, and in FIG. 17, the dielectric-encapsulant 80 is then ground back to expose the temporary pillars 60. The dielectric-encapsulant 80 may be a polymer, such as Ajinomoto Build-up Film (ABF), or the like, and may also have dielectric properties. The dielectric-encapsulant 80 may be formed using a compression molding process, a lamination process, or the like, and then, may be cured. In FIG. 17, the dielectric-encapsulant 80 is ground, such as by using a grinding wheel and/or chemical mechanical polish (CMP), to expose the temporary pillars 60.

Figure 18:
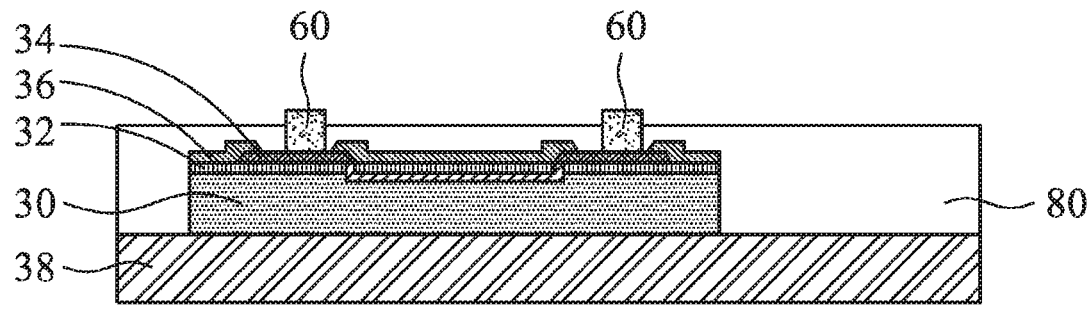
Figure 19:
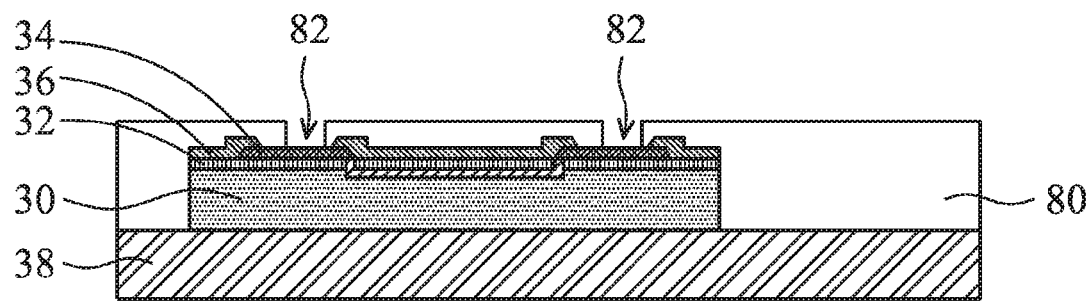

In FIG. 18, the dielectric-encapsulant 80 is formed with the temporary pillars 60 being exposed through the dielectric-encapsulant 80. The temporary pillars 60 may be exposed through the dielectric-encapsulant 80, for example, by using a compression molding process with a compressible and releasable film on a mold plate. When the compression plate with the compressible film contacts the dielectric-encapsulant 80, the temporary pillars 60 may be pressed into the compressible film, and the compressive force may cause the encapsulant to recede to a level below tops portions of the temporary pillars 60. Example materials for a compressible film on the mold plate include silicone, or the like. A compressible film may be, for example, 200 μm thick In FIGS. 17 and 18, the dielectric-encapsulant 80 is formed laterally encapsulating the die 30 and over the passivation layer 36 and pads 34. As shown, the dielectric-encapsulant 80 continuously extends from a region disposed laterally from the die 30 to a region disposed directly above the die 30. For example, there is no vertical interface (where vertical, as shown, is in a direction perpendicular to a top surface of the die 30) with a different dielectric material near a lateral edge of the die 30, e.g., not directly over pad 34 of the die 30. After FIG. 17 or FIG. 18, the temporary pillars 60 are removed to create openings 82 to the pads 34, as shown in FIG. 19. In embodiments where the temporary pillars 60 are a photoresist, the temporary pillars may be removed using an appropriate stripping process. In other embodiments, the temporary pillars may be removed by etching.

Figure 20:
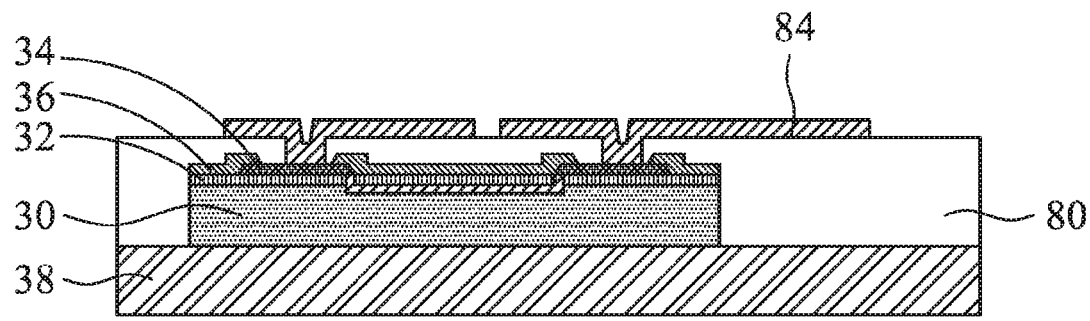

In FIG. 20, a first conductive pattern 84 is formed over the dielectric-encapsulant 80 and in the openings 82 to the pads 34. The first conductive pattern 84 comprises various traces and/or vias. The first conductive pattern 84 in an example comprises a metal such as copper, titanium, the like, or a combination thereof, formed by a plating process, such as electroless plating, electroplating, or the like, such as discussed above with respect to FIG. 3.

Figure 21:
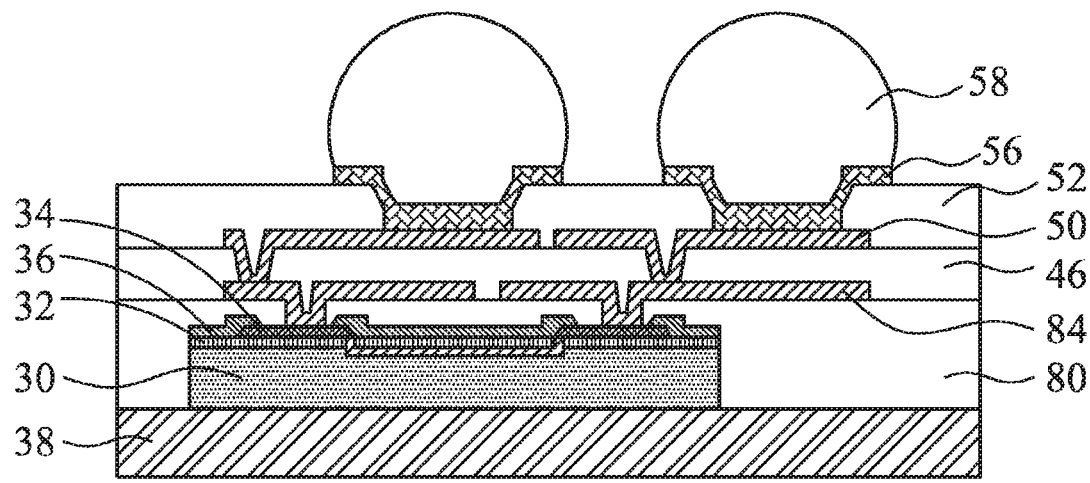

In FIG. 21, the second dielectric layer 46, second conductive pattern 50, third dielectric layer 52, bond pads 56, and external electrical connectors 58 are formed as discussed with respect to FIGS. 4 through 7.

Embodiments may achieve advantages. For example, a cost of fabricating a package according to an embodiment may have reduced costs due to, for example, fewer and/or cheaper processing steps. Additionally, via patterns to pads, e.g., pad 34, may have a more controllable feature size (such as when a critical dimension is between 5 μm and 200 μm), feature size uniformity, sidewall angle, and edge roughness.

An embodiment is a structure comprising a die comprising an electrical pad on an active side, and an encapsulant laterally around the die and extending directly over the active side of the die. A first conductive pattern is over the encapsulant, and the first conductive pattern comprises a first via in a first opening through the encapsulant to the electrical pad. The via contacts the electrical pad.

Another embodiment is a structure comprising a die having an electrical pad on a side, and an encapsulant around the die and over the side of the die. The encapsulant continuously extends from a first region laterally displaced from the die in a direction parallel to the side of the die to a second region directly over the side of the die. A first conductive pattern is over the encapsulant, and the first conductive pattern comprises a first via in a first opening through the encapsulant to the electrical pad. A first dielectric layer is over the encapsulant and the first conductive pattern. A second conductive pattern is over the first dielectric layer, and the second conductive pattern comprises a second via in a second opening through the first dielectric layer to the first conductive pattern.

A further embodiment is a method comprising forming an encapsulant laterally encapsulating a die and over an active surface of the die, the active surface comprising an electrical pad; forming a first opening through the encapsulant to the electrical pad; forming a first conductive pattern over the encapsulant, the first conductive pattern comprising a first via in the first opening to the electrical pad; forming a first dielectric layer over the encapsulant and the first conductive pattern; and forming a second conductive pattern over the first dielectric layer, the second conductive pattern comprising a second via electrically coupled to the first conductive pattern.

Some embodiments include a method comprising depositing an encapsulant laterally encapsulating a die and over an active surface of the die, the active surface including an electrical pad; removing encapuslant to form a first opening through the encapsulant to the electrical pad using a photolithographic technique; and depositing a first conductive pattern over the encapsulant. The first conductive pattern can include a first via in the first opening to the electrical pad.

Some embodiments include a method comprising disposing a temporary pillar on an electrical pad of a die; depositing an encapsulant laterally encapsulating the die and over an active surface of the die, the active surface including the electrical pad; removing the temporary pillar to form a first opening through the encapsulant to the electrical pad; and disposing a first conductive pattern over the encapsulant. The first conductive pattern can include a first via in the first opening to the electrical pad.

Some embodiments include a method comprising disposing a temporary pillar on an electrical pad of a die; depositing an encapsulant laterally encapsulating the die and over an active surface of the die, the active surface including the electrical pad; removing the temporary pillar to form a first opening through the encapsulant to the electrical pad; depositing a first dielectric layer over the encapsulant and in the first opening; patterning the first dielectric layer to form a second opening within the first opening, the first dielectric remaining in contact with sidewalls of the first opening, the second opening reaching the electrical pad; and forming a first conductive pattern over the first dielectric layer. The first conductive pattern can include a first via in the second opening to the electrical pad.

Some embodiments include a method comprising depositing an encapsulant laterally encapsulating a die and over an active surface of the die, the active surface including an electrical pad, the encapsulant including a photo-patternable material. A first opening is formed through the encapsulant to the electrical pad using a photolithographic technique. A first conductive pattern is deposited over the encapsulant, the first conductive pattern including a first via in the first opening to the electrical pad.

Some embodiments include a method comprising depositing an encapsulant completely surrounding an active surface and sidewalls of a die, the die disposed on a carrier, the active surface including an electrical pad. Portions of the encapsulant are exposed to light. A first opening is formed through the encapsulant, exposing the electrical pad. The encapsulant is cured and a first conductive pattern is deposited over the encapsulant, the first conductive pattern contacting the electrical pad.

Some embodiments includes a structure comprising a die including an electrical pad on an active side. An encapsulant is laterally around the die and extends directly over the active side of the die, where a first portion of the encapsulant over the die is continuous with a second portion of the encapsulant laterally surrounding the die, such that no interface is between the first portion and the second portion. The encapsulant includes a cured photo-patternable material. A first conductive pattern is disposed over the encapsulant where the first conductive pattern includes a first trace over the encapsulant and a first via extending through the encapsulant to contact the electrical pad.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   disposing a die on an uppermost surface of a carrier substrate by a die attach film, the die having an active surface opposite the carrier substrate, the active surface comprising an electrical pad and a passivation layer disposed over the electrical pad, the passivation layer contacting a top metal layer of an interconnect of the die, the electrical pad contacting the top metal layer of the interconnect of the die, the electrical pad interposed between the passivation layer and the top metal layer of the interconnect of the die, a portion of an upper surface of the electrical pad exposed from the passivation layer, and a first portion of the passivation layer having a bottom surface that contacts the upper surface of the electrical pad;
   depositing an encapsulant laterally encapsulating the die and over the active surface of the die, the encapsulant comprising a photo-patternable material;
   exposing the encapsulant to a patterned light exposure, the patterned light exposure corresponding to a set of openings to be formed in the encapsulant, the patterned light exposure exposing a thickness of the encapsulant between a top surface of the encapsulant and the active surface of the die;
   developing the encapsulant after the patterned light exposure to form a set of openings through the encapsulant, thereby exposing the electrical pad, each opening of the set of openings having angled sidewalls;
   depositing a first conductive pattern over the encapsulant, the first conductive pattern comprising a first via in a first opening of the set of openings to the upper surface of the electrical pad, wherein a portion of the encapsulant is interposed between the first portion of the passivation layer and the first via; and
   removing the carrier substrate after forming a connector electrically coupled to the first conductive pattern.

2. The method of claim 1, wherein the encapsulant is a dielectric material.

3. The method of claim 1, wherein the first conductive pattern has a portion in the first via with a top surface below a top surface of the encapsulant.

4. The method of claim 1, further comprising:
   depositing a first dielectric layer over the encapsulant;
   removing a portion of the first dielectric layer to form a second opening through the first dielectric layer to the first conductive pattern; and
   depositing a second conductive pattern over the first dielectric layer, the second conductive pattern comprising a second via in the second opening to the first conductive pattern.

5. The method of claim 4, wherein the second opening has sidewalls that are not perpendicular to a top surface of the die.

6. The method of claim 4, further comprising:
   depositing a second dielectric layer over the first dielectric layer;
   removing a portion of the second dielectric layer to form a third opening through the second dielectric layer to the second conductive pattern; and forming an under bump metal layer in the third opening, the under bump metal layer coupled to the second conductive pattern.

7. The method of claim 1, wherein the passivation layer has a first sidewall surrounding the upper surface of the electrical pad which is exposed from the passivation layer, the first sidewall being angled, wherein the passivation has a second sidewall adjacent to the electrical pad which is vertical.

8. A method comprising:
attaching a die to a carrier substrate by a die attach film, the die being attached to an uppermost surface of the carrier substrate;
applying a compression molding to deposit a photosensitive encapsulant completely covering an active surface of the die and surrounding sidewalls of the die, the active surface comprising an electrical pad and a passivation layer extending over the electrical pad from sidewall-to-sidewall of the die, a portion of the electrical pad exposed from the passivation layer and in contact with the encapsulant, the passivation layer contacting a top metal layer of an interconnect of the die;
exposing a first thickness of the encapsulant to a light pattern, the light pattern corresponding to portions of the encapsulant which are to be removed in a subsequent developing process, the first thickness corresponding to a thickness of the encapsulant between an upper surface of the encapsulant over the electrical pad and an upper surface of the electrical pad;
developing the encapsulant to form a first opening through the encapsulant, exposing the electrical pad;
depositing a first conductive pattern over the encapsulant, the first conductive pattern contacting the electrical pad, an interface between the first conductive pattern and the electrical pad being surrounded by the encapsulant and vertically aligned with a portion of the passivation layer, wherein a portion of the encapsulant is interposed between a portion of the passivation layer which is over the electrical pad and the first conductive pattern;
depositing a first dielectric layer by spin coating a photosensitive dielectric material over the encapsulant and over the first conductive pattern, the first dielectric layer having a substantially flat uppermost surface;
exposing a second thickness of the first dielectric layer to a second light pattern, the second light pattern corresponding to portions of the first dielectric layer which are to be removed in a subsequent developing process;
developing the first dielectric layer to form a second opening through the first dielectric layer, the second opening exposing a portion of the first conductive pattern; and
decomposing the die attach film to release the carrier substrate from the die and encapsulant.

9. The method of claim 8, further comprising:
depositing a second conductive pattern over the first dielectric layer, the second conductive pattern comprising a second via in the second opening to the first conductive pattern.

10. The method of claim 9, further comprising:
depositing a second dielectric layer over the first dielectric layer;
removing a portion of the second dielectric layer to form a third opening through the second dielectric layer to the second conductive pattern; and forming an under bump metal layer in the third opening, the under bump metal layer coupled to the second conductive pattern.

11. The method of claim 8, wherein the encapsulant is a dielectric material.

12. The method of claim 8, wherein the first opening has tapered sidewalls, and wherein a second opening of the passivation layer exposing the electrical pad from the passivation layer has tapered sidewalls corresponding to the tapered sidewalls of the first opening.

13. The method of claim 8, wherein a portion of the first conductive pattern contacting the electrical pad has a top surface below a top surface of the encapsulant.

14. The method of claim 8, wherein a thickness of the electrical pad over the top metal layer of the interconnect of the die is the same as a thickness of a portion of the passivation layer in contact with the top metal layer of the interconnect of the die.

15. A method comprising:
placing a die on an uppermost surface of a carrier substrate by a pick and place tool, the die comprising a top metal layer of an interconnect, a contact pad disposed on the top metal layer of the interconnect, and a passivation structure disposed on the top metal layer of the interconnect and extending over the contact pad, a first opening in the passivation structure exposing a portion of the contact pad from the passivation structure;
laterally encapsulating a die with an encapsulant, the encapsulant extending over a top surface of the die;
photo-patterning the encapsulant without using a separate photo resist mask, to form a second opening through the encapsulant to the contact pad of the die, the second opening having tapered sidewalls, the second opening aligned over the die;
curing the encapsulant;
depositing a first conductive pattern over the encapsulant and in the second opening, the first conductive pattern electrically coupled to the contact pad, wherein a via portion of the first conductive pattern in the second opening lines the second opening, wherein a portion of the encapsulant is interposed between a portion of the passivation structure which is over the contact pad and the via portion of the conductive pattern;
depositing a first dielectric layer over the first conductive pattern, the first dielectric layer extending into the second opening between sidewalls of the via portion of the first conductive pattern, a vertical extent of the first dielectric layer being lower than an upper surface of the encapsulant;
exposing the first dielectric layer to a second light pattern, the second light pattern corresponding to portions of the first dielectric layer which are to be removed in a subsequent developing process;
developing the first dielectric layer to form a third opening through the first dielectric layer, the third opening exposing a portion of the first conductive pattern; and
detaching the carrier substrate from the die and encapsulant.

16. The method of claim 15, wherein the encapsulant extends continuously from a side of the die to over the top surface of the die.

17. The method of claim 15, further comprising:
depositing a second conductive pattern over the first dielectric material layer, the second conductive pattern electrically coupled to the contact pad through the second opening.

18. The method of claim 17, wherein the first dielectric material layer comprises a material composition different than the encapsulant.

19. The method of claim 15, wherein depositing the first conductive pattern comprises:
- depositing a first seed layer over the encapsulant and in the second opening;
- depositing a photo mask over the first seed layer;
- patterning the photo mask to form pattern openings in the photo mask corresponding to the first conductive pattern;
- plating a conductive material in the pattern openings to form the first conductive pattern;
- removing the photo mask; and
- removing portions of the first seed layer which are not covered by the plated conductive material.

20. The method of claim 15, wherein the second opening has sidewalls that are angled with respect to a vertical line, the vertical line being a line perpendicular to a top surface of the die.

* * * * *